| United States Patent [19] | [11] Patent Number: 5,310,869 |
|---|---|
| Lewis et al. | [45] Date of Patent: * May 10, 1994 |

[54] PRINTING PLATES IMAGEABLE BY ABLATIVE DISCHARGE AND SILICONE FORMULATIONS RELATING THERETO

[75] Inventors: Thomas E. Lewis, E. Hampstead, N.H.; Michael T. Nowak, Gardner, Mass.

[73] Assignee: Presstek, Inc., Hudson, N.H.

[*] Notice: The portion of the term of this patent subsequent to May 18, 2010 has been disclaimed.

[21] Appl. No.: 22,528

[22] Filed: Feb. 25, 1993

Related U.S. Application Data

[63] Continuation-in-part of Ser. No. 616,377, Nov. 21, 1990, Pat. No. 5,212,048.

[51] Int. Cl.$^5$ .................................................. G03C 1/492
[52] U.S. Cl. .................................... 430/272; 430/275
[58] Field of Search ............................... 430/272, 275

[56] References Cited

U.S. PATENT DOCUMENTS

| 3,511,178 | 5/1970 | Curtin . |
| 3,632,375 | 1/1972 | Gipe . |
| 3,890,149 | 6/1975 | Schlesinger et al. . |
| 4,009,032 | 2/1977 | Schank . |
| 4,019,904 | 4/1977 | Noshiro et al. . |
| 4,020,761 | 5/1977 | Ogiwara et al. . |
| 4,179,295 | 12/1979 | Takamizawa et al. . |
| 4,254,209 | 3/1981 | Abe et al. . |
| 4,259,905 | 4/1981 | Abiko et al. . |
| 4,291,114 | 9/1981 | Berggren et al. . |
| 4,308,799 | 1/1982 | Kitagawa et al. . |
| 4,465,818 | 8/1984 | Shirahata et al. . |
| 4,472,563 | 9/1984 | Chandra et al. . |
| 4,596,733 | 6/1986 | Cohen et al. . |
| 4,686,138 | 8/1987 | Toyama et al. . |
| 4,735,971 | 4/1988 | Inoue et al. . |
| 4,769,308 | 9/1988 | Hiruma et al. . |
| 4,806,391 | 2/1989 | Shorin . |
| 4,826,752 | 5/1989 | Yoshida et al. . |
| 4,842,990 | 6/1989 | Herrmann et al. . |
| 4,853,313 | 8/1989 | Mori et al. . |
| 4,861,698 | 8/1989 | Hiruma et al. . |
| 4,874,686 | 10/1989 | Urabe et al. . |
| 4,911,075 | 3/1990 | Lewis et al. . |
| 5,212,048 | 5/1993 | Lewis et al. ................. 430/275 |

FOREIGN PATENT DOCUMENTS

| 0334067 | 2/1989 | European Pat. Off. . |
| 0333156 | 3/1989 | European Pat. Off. . |
| 0333186 | 3/1989 | European Pat. Off. . |
| 0338947 | 10/1989 | European Pat. Off. . |
| 6474541 | 3/1989 | Japan . |
| 1118843 | 5/1989 | Japan . |
| 1167843 | 7/1989 | Japan . |
| 1179047 | 7/1989 | Japan . |
| 1214839 | 8/1989 | Japan . |
| 1223462 | 8/1989 | Japan . |
| 1235956 | 9/1989 | Japan . |
| 1258308 | 10/1989 | Japan . |
| 27047 | 1/1990 | Japan . |

OTHER PUBLICATIONS

Wheeler et al., 106 *J. Am. Chem. Soc.* 7404 (1984).
Eckberg & Riding, *1989 Proc. of Radiation Technologies Conf.* 311.
9 *Organometallics* 1330 (1990).

Primary Examiner—Jack P. Brammer
Attorney, Agent, or Firm—Cesari and McKenna

[57] ABSTRACT

Planographic printing plates coated with a two-component silicone formulations that consist of a high-molecular-weight silicone component and a low-molecular-weight silicone polymer. The components are combined in varying proportions with a cross-linking agent to produce compositions of varying viscosities and dispersibilities. The high-molecular-weight component is linear polysiloxane compound with a molecular weight of at least 300,000, and preferably 500,000 or higher. The low-molecular-weight component has a similar structure, with a molecular weight no greater than 70,000. Various substitutions are made to facilitate cross-linking among components. The coatings can contain pigments or other materials to enhance imaging performance.

35 Claims, No Drawings

PRINTING PLATES IMAGEABLE BY ABLATIVE DISCHARGE AND SILICONE FORMULATIONS RELATING THERETO

RELATED APPLICATION

This is a continuation-in-part of Ser. No. 07/616,377, filed on Nov. 21, 1990, now U.S. Pat. No. 5,212,048.

BACKGROUND OF THE INVENTION

A. Field of the Invention

The present invention relates to lithographic printing, and in particular to plate constructions imageable by ablative discharge as well as to polymeric silicone coating formulations useful in connection therewith.

B. Description of the Related Art

Polyorganosiloxane compounds, or "silicones", can be synthesized in a wide variety of forms, and are utilized in numerous commercial applications. Silicone compounds are based on the repeating diorganosiloxane unit $(-R_2SiO-)_n$, where R is an organic radical and n denotes the number of units in the polymer chain. Each end of the linear chain is terminated with a functional or non-functional end group; the chain may also be "branched" so as to deviate from a strictly linear structure.

The physical properties of a particular silicone formulation depend on the length of the polymer chain, the nature of the organic functional groups bonded to the silicon atoms, and the terminal groups (more precisely, the alpha and omega groups) at each end of the chain. For example, the most common silicone compounds are based on the polydimethylsiloxane unit, $-Si(CH_3)_2O-$, which, due to the relatively small organic content of the chains, have a limited range of compatibility with organic compounds. By contrast, silicones containing aryl functional groups tend to exhibit properties more commonly associated with organic materials, and such silicones are generally miscible with a broader range of such materials.

Many polymeric silicone compounds exhibit rubber-like characteristics. These compounds are employed in numerous industrial and commercial environments as a direct substitute for natural rubber. "Silicone rubber" is typically prepared from "silicone gum", which connotes a viscous, high-molecular-weight polydiorganosiloxane compound, by cross-linking (or "curing") the polymer chains. It is often convenient to form silicone rubber in situ on a surface by applying components that will form the rubber and subsequently curing these. Curing (or cross-linking) permanently immobilizes the polymeric components of the rubber by establishing chemical linkages between them.

Curing can be accomplished in a number of ways, but generally depends on the presence of reactive functional groups on the polymer chains that interact and bond with one another. "Condensation cure" reactions refer to those in which a small molecule is eliminated when the two functional groups are joined. Typical condensation-cure reactions in silicone chemistry involve combination of silanol functional groups with other such groups to produce an oxygen linkage with the elimination of water. "Addition cure" reactions involve no loss of species, and can involve, for example, hydrosilylation reactions between olefinic functional groups (such as vinyl) and hydrosiloxane groups.

Variations on the traditional condensation-cure reaction include the "moisture-cure" approach, in which a precursor functional group is first hydrolyzed to form a reactive hydroxyl-bearing group, which then combines with a silanol group as discussed above. Suitable precursor compounds include acetoxy, alkoxy and ketoxime functional silanes, which form acid, alcohol and ketoxime byproducts, respectively, upon hydrolysis.

Silanol-functional silicones and mixtures of silanol-functional silicones with silicones containing acetoxy, alkoxy or ketoxime groups are relatively stable so long as moisture is excluded; this is particularly true for silicone polymers having appreciable molecular weights. Obtaining useful reaction rates generally requires a catalyst such as a metal carboxylate compound.

Silanol groups also react with hydrosiloxane species to liberate hydrogen and produce the silicon-oxygen-silicon linkage characteristic of the condensation cures. Use of a metal salt catalyst (such as dibutyltindiacetate) is generally necessary to achieve useful reaction rates. Because it proceeds rapidly when catalyzed, this reaction is widely used for silicone coating formulations applied on a coating line to a web substrate.

In addition to these mechanisms, silicone polymers are sometimes cross-linked using multifunctional acrylate or methacrylate monomers. The polymers are exposed to an electron beam or combined with a photoinitiator species and then exposed to actinic radiation in order to produce free-radical derivatives that combine with one another. Other approaches to cross-linking are described in U.S. Pat. No. 4,179,295, the entire disclosure of which is hereby incorporated by reference.

The reactive, cross-linking functional groups can be incorporated at the termini of a polymer chain, or at a desired frequency within a copolymer chain. In order to achieve the elastomeric properties associated with silicone rubber, large polymeric units ("base polymers") are cross-linked by smaller oligomers or multifunctional monomers. Frequently, this is accomplished by providing the base polymers with one type of functional group, and incorporating the complementary functional group on the cross-linking molecules. For example, the addition-cure reaction described above can be utilized to produce elastomeric compositions by combining base polymer or copolymer chains that contain olefinic functional groups with small cross-linking molecules that have hydrosiloxane-functional termini.

Silicone rubber coatings have been adopted by some manufacturers of planographic printing plates. Planographic printing, as contrasted with letter-press and gravure printing, relies on plate constructions in which image and non-image areas lie substantially in the same plane. The plate is prepared by altering the affinities of different areas of the plate for ink. Depending on the type of plate imaging system employed, non-image plate areas become (or remain) oleophobic, or ink-repellent, while image areas remain (or become) oleophilic, or ink-accepting. Ink applied to the plate surface, e.g., by a roller, will adhere to the oleophilic image areas but not the oleophobic non-image areas. The inked plate is then applied to the recording medium (in direct printing) or to an intermediate "blanket" cylinder which then transfers the image to the recording medium (in offset printing).

Manufacturers of planographic printing plates often employ silicone rubber compositions as plate coatings due to their oleophobic character, which provides compatibility with conventional planographic printing techniques. Silicone coatings are commonly used in conjunction with so-called "dry" plates. In contrast to the traditional "wet" plate, which requires application of a fountain or dampening solution to the plate prior to inking in order to prevent ink from adhering to and transferring from non-image areas, the non-image material of dry plates is itself sufficiently ink-repellent that no fountain solution is necessary.

One hypothesis explains this effect as arising from interaction between the non-image component of a dry plate and the (usually aliphatic) solvent or solvents employed in printing inks, resulting in the formation of a thin layer of solvent on the surface of the non-image component. Like the fountain solution of a wet plate, this surface layer acts as a boundary and prevents the ink from adhering to the plate.

Blank dry plates are subjected to an imaging process that removes the silicone coating from image areas to reveal an oleophilic surface. Imaging can be accomplished in a number of ways. Photosensitization methods rely on incorporation of a photoresist material in the plate structure which, upon exposure to radiation (e.g., visible light), alters the solubility or anchorage properties of the silicone. In typical commercial plates, exposure to light results either in firm anchorage of the silicone coating to the plate (in positive-working plates) or in destruction of the existing anchorage (in negative-working plates). Depending on the process chosen, the plate is first exposed to actinic radiation passing through a positive or negative rendition of the desired image that selectively blocks transmission of the radiation to the plate. After this exposure step, the plate is developed in chemical solvents that either anchor the exposed silicone or remove it to produce the final, imaged plate.

For example, a number of photosensitive dry-plate constructions are currently known and used in the art. In one approach, the photosensitive material is combined with the silicone coating prior to its application onto a substrate. Another construction relies on incorporation of the photosensitive compound within an underlying layer, exposure either weakening or strengthening the bond between layers. See, e.g., U.S. Pat. Nos. 3,511,178 and 4,259,905. In a third alternative, ink-accepting toner particles are fixed to the silicone surface according to the desired image pattern.

Plates can also be imaged by means other than photoexposure, e.g., by ablation using spark-discharge apparatus (such as that described in U.S. Pat. No. 4,911,075, the entire disclosure of which is hereby incorporated by reference) or laser-discharge apparatus (such as that described in Ser. No. 07/917,481, the entire disclosure of which is hereby incorporated by reference) that utilize electronic signals to locate and produce a discharge at the precise positions on the plate where the silicone coating is to be removed to reveal an underlying oleophilic surface. The spark-discharge apparatus can make contact with the plate or be held at a relatively fixed distance above the plate during the imaging process.

Silicone compositions used as coatings for planographic printing plates typically include two basic constituents, namely, a primary polyorganosiloxane basepolymer component and a smaller cross-linking component. The base component is usually a linear, predominantly polydimethylsiloxane copolymer or terpolymer containing unsaturated groups (e.g., vinyl) or silanol groups as reactive centers for bonding with the cross-linking molecules. These groups are commonly situated at the chain termini; alternatively, it is possible to utilize a copolymer incorporating the reactive groups within the chain, or branched structures terminating with the reactive groups. It is also possible to combine linear difunctional polymers with copolymers and/or branch polymers. See, e.g., published Japanese Patent Applications 1-118843 and 1-179047.

The cross-linking component is generally a multifunctional, monomeric or oligomeric compound of low molecular weight, which is reacted with the first component to create connections among the chains thereof. The curing reaction generally requires some type of catalyst, either chemical or physical, to produce favorable kinetics. Platinum metal complexes (such as chloroplatinic acid) are often employed to facilitate addition cures, while metal salt catalysts (such as a dialkyltindicarboxylate) are frequently used in conjunction with condensation cures.

If the functional groups of the cross-linking component are situated at the chain termini, cross-linking molecules will form bridges among the base-polymer molecules (particularly if the latter have functional groups distributed along the chains). On the other hand, if the cross-linking component contains functional groups distributed along its length, each molecule will form numerous points of attachment with the base-polymer molecules. Typically, this type of cross-linking molecule is combined with base polymers having chain-terminal functional groups in order to maximize the number of different base-polymer molecules attached to each cross-linking chain.

Modifiers can be added to alter physical properties, such as adhesion or rheology, of the finished coating. One can also add colorants, in the form of dyes or pigments, to the silicone formulation to facilitate quality-assurance evaluation or monitoring of the photoexposure process. Pigments and/or dyes can also be used to enhance imaging performance in plates that will be imaged by ablation using discharge apparatus, as further described herein.

Current silicone coating formulations suffer from a number of disadvantages, some stemming from physical characteristics of the polymer system itself, and others arising from the requirements of available coating apparatus. Silicone coatings are generally prepared by combining a silicone polymer with a solvent (usually aliphatic) and, possibly, other volatile components to control viscosity and assist in deposition. Because the solvent evaporates after the coating is applied, the amount of silicone actually deposited per unit surface area depends on the relative proportions of silicone and volatile components; this proportion is referred to as the "solids content" of the composition, and is typically expressed as a percentage. Too little solvent can produce a coating that is difficult to apply, while excessive proportions of solvent can result in deposition of too little of the actual silicone material during coating, thereby reducing plate durability. The relatively low-weight polymers currently employed for producing printing plates tend to exhibit low solution viscosities; because of the necessity of preserving a minimum viscosity level for coating purposes, this characteristic limits the extent to which low-weight silicones can be diluted with solvent to control the deposition rate. Furthermore, these coatings also tend to require a narrow range of solids content for uniform application, a constraint that results in further limitation of the ability to vary dilution.

Finally, low-weight silicone compositions form poor dispersions with solid particles. For a growing number of platemaking applications, introduction of pigments or other particles is necessary for optimum plate performance. Not only is it difficult initially to disperse particles in low-weight silicones, but over time the particles that have, in fact, been dispersed tend to reagglomerate. Moreover, the above-noted problems involving low solution viscosities and narrow solids-content requirements become accentuated when particles are introduced into low-weight compositions.

A silicone coating composition is applied to a plate substrate using any of a variety of well-known coating techniques. The choice of technique is critical not only to the ultimate performance of the plate, but also to the efficiency and reliability of the overall platemaking process. Typical coating techniques include roll coating, reverse-roll coating, gravure coating, offset-gravure coating, and wire-wound rod coating. The coating procedure must be rapid enough to achieve a satisfactory production rate, yet produce a highly uniform, smooth, level coating on the plate. Even small deviations in coating uniformity can adversely affect plate performance, since the planographic printing process depends strongly on coplanarity of image and non-image areas; in other words, the printing pattern reproduced by the plate must reflect the configuration of oleophilic and oleophobic areas impressed thereon, and remain uninfluenced by topological characteristics of the plate surface.

Because the physical properties of a given silicone formulation can be varied only to a limited extent by the use of solvents and modifiers (especially in the case of low-weight silicones), particular coating formulations tend to favor use in conjunction with a particular type of coating line. For example, addition-cure coatings having 100% solids content are most advantageously applied using offset gravure-type coating equipment. For formulations having low viscosities (which typically imply low solids contents), roll-coating and rod-coating applications are preferred.

However, as a practical matter, the number of coating lines available to a particular manufacturer is likely to be limited. It may therefore prove impossible to utilize a particular silicone formulation with readily available coating technology, forcing plate manufacturers to choose formulations based on compatibility with their coating lines rather than optimal performance for a given application.

This limitation can prove appreciable, since coating properties required for a particular application may narrow the range of acceptable formulations. Some coating properties, such as durability, can depend not only on the silicone formulation or solids content, but also on the surface to which the coating is applied and the environment in which it is used. Other characteristics, such as the ability of the silicone matrix to accept and retain dispersions of large amounts of particulate material (a particularly important feature for spark-discharge planographic applications), can rule out entire classes of formulations and/or severely limit the number of coating techniques that may be employed.

DESCRIPTION OF THE INVENTION

A. Objects of the Invention

It is, therefore, an object of the present invention to provide novel silicone formulations containing two base polymers, the proportions of which can be varied to control the viscosity of the coating composition and the physical properties of the cured coating.

It is another object of the present invention to provide silicone formulations into which relatively large amounts of particulate material can be readily dispersed and maintained as a stable dispersion.

It is a further object of the invention to provide silicone formulations that may be uniformly applied to a planographic printing plate with good control of the amount of coating actually deposited on a surface.

It is still another object of the invention to provide planographic printing plate constructions having silicone coatings containing two base polymers, the proportions of which can be varied to control the viscosity of the coating composition and the physical properties of the cured coating on the plate.

Still a further object of the invention is to provide planographic printing plate constructions having silicone coatings that contain relatively large amounts of particulate material dispersed therein.

Other objects will, in part, be obvious and will, in part, appear hereinafter. The invention accordingly comprises the compositions, features of construction, combination of elements, arrangement of parts, and relations of process steps that will be exemplified in the following description, and the scope of the invention will be indicated in the claims.

B. Summary of the Invention

The compositions of the present invention comprise silicone systems having two primary components, a high-molecular-weight silicone gum and a distinctly lower-molecular-weight silicone polymer. These components are combined in varying proportions with a suitable cross-linking agent to produce compositions of varying viscosities, and good dispersibilities and dispersion stability.

As used herein, the term "base polymer component" refers to one of the primary polymers. The fact that we describe compositions having more than one base polymer component should not lead to confusion with descriptions of traditional silicone coating formulations, in which a "two-component" system denotes a composition having a single base polymer and a cross-linking agent. Furthermore, traditional compositions also contain modifiers that promote adhesion or otherwise alter physical properties, and these additives also should not be confused with a second silicone component.

The advantages offered by the present invention stem, in part, from the use of a high-molecular-weight gum stock as a primary system component. Silicone gums having high dimethylsiloxane content can be used to create coatings that resist adhesion (that is, exhibit the property sometimes referred to as "abhesion") to compounds such as ink. We have also found that silicone-gum based polymeric systems are amenable to stable dispersion with solid particulates and can be applied with greater uniformity using a variety of coating lines as compared with lower-weight compositions. The former feature stands in marked contrast to polymers prepared from lower-weight silicones; as discussed above, such compositions are difficult to use the basis for dispersions.

On the other hand, silicone compositions prepared solely from gum stock tend to lack durability, particularly in the demanding environment of planographic printing. Our experience indicates that coatings prepared solely from the lower-weight polymers perform more durably, although these compositions tend to suffer from uniformity and dispersibility limitations. Furthermore, the viscosities of these low-molecular-weight polymers can be varied only within a limited range.

By combining these two components, we are able to achieve, in a single formulation, the advantages of compositions prepared from silicone gums and those prepared from lower-weight polymers, while minimizing the disadvantages associated with either type of composition individually. Specifically, we are able to disperse (and retain as dispersions) relatively large amounts of solids into our compositions, and control both system viscosity and durability by varying the proportions of the high-molecular-weight gum component (which exhibits high solution viscosity) and the low-molecular-weight component (which exhibits low solution viscosity and better durability characteristics).

In one embodiment of the invention, we vary the positions of each component's cross-linking constituents. For example, readily available gum compositions have functional (cross-linking) groups distributed along the chain, while it is possible to obtain lower-weight polymers with functional groups limited to the chain termini. Placement of identical functional groups at different positions within the molecular structures of the two components allows us to produce polymer systems consisting of two integrated networks that each combine differently with the cross-linking molecules, thereby contributing to the properties of the bulk material in different ways.

In another embodiment, we provide each component with a different functional group or groups, thereby retaining independent control over each component's interaction with cross-linking molecules. The cross-linking component can consist of a single molecular species that contains two different functional groups, each complementary to the functional group associated with one of the base polymers. The positions of the functional group within each base polymer and within the cross-linking molecules can also be varied to achieve different physical properties.

Utilizing different functional groups for each component allows us to control the extent, rate and timing of cure for each component independently of the other, since each component cross-links by a different chemical reaction. This "dual cure" capability allows us to combine, in one formulation, physical properties normally associated with a single type of cross-linking mechanism; it also affords greater flexibility in the choice of a coating deposition technique.

C. Detailed Description of the Preferred Embodiments

1. Constituents

The first base-polymer component of the compositions of the present invention is a high-molecular-weight polysiloxane compound with a molecular weight of at least 300,000, and preferably 500,000 or higher. The structure of this compound is generally linear. While it is possible to introduce a minor amount of branching, significant deviation from a linear structure decreases desirable properties such as good flow and elastomeric characteristics.

This first component preferably comprises a chain of dimethylsiloxane groups, $[-(CH_3)_2SiO-]_n$. However, we have also obtained advantageous results with copolymers of dimethylsiloxane and higher methylalkysiloxanes having up to 18 carbons in the alkyl group (larger alkyl groups tend to adversely affect ink-release and durability properties of the finished coating); phenylmethylsiloxanes; diphenylsiloxanes; and 3,3,3-trifluoropropylmethylsiloxane. Phenylmethyl and diphenylsiloxanes tend to confer heat tolerance, while the trifluoro compounds offer greatest resistance to most of the aliphatic and aromatic solvents that are commonly found in printing inks. However, to preserve favorable ink-release properties, the proportion of dimethylsiloxane to other functional groups is preferably at least 70%. In the case of trifluoropropylmethylsiloxane, the proportion thereof to dimethylsiloxane can range up to 80%, while for phenylmethylsiloxane or diphenylmethylsiloxane groups the proportion to dimethylsiloxane preferably does not exceed 20%.

The first base-polymer component preferably contains functional groups randomly distributed along the polymer chain (and, if desired, as chain-terminating groups as well). Although in some cases it may be possible to utilize functional groups located solely at the chain termini of this component, we would expect to obtain less advantageous cross-linked structures using such compounds.

The functional group is introduced by incorporating substituted siloxane monomers into the polymerization reaction mixture, according to methods well-known in the art. The frequency of cross-linking (and, hence, the extent of curing) in the coating into which this component is introduced generally depends on the ratio of siloxane units containing functional groups to those which do not.

It is also possible to alter the physical properties of the cross-linked polymer while maintaining a constant mole percentage of functional groups by utilizing disubstituted monomer units, thereby introducing two functional groups at a given chain position. Assuming the substituted monomers are randomly distributed along the polymer chain, this strategy results in greater spacing between the cross-linking sites but also creates locally higher cross-link density (because two functional groups are free to react) at each cross-linking position. Polymers produced using this disubstituted approach yield coatings that exhibit elasticities similar to those based on monosubstituted polymers having a similar weight percentage of functional groups (the greater spacing between reactive monomer units and locally higher cross-link densities tending to balance one another), and therefore retain good durability characteristics. Such compositions are particularly useful in the preparation of printing plates that employ flexible-film substrates, where elasticity of the coating is critical.

The second base-polymer component of our formulations is a relatively light polysiloxane compound with a molecular weight up to 70,000 but in excess of 5,000, with molecular weights in the range 40,000–50,000 being preferred. The structure of this compound is preferably substantially linear, although once again it is possible to introduce a minor amount of branching. The functional-group characteristics described above with regard to the first component apply as well to this second component. However, it is preferable to have the functional groups in this second component situated at the ends of the polymer chains. This positioning has been found to promote durability, while random distribution along the chain produces distinctly less elastomeric compositions in combination with the first base-polymer discussed above.

The relative proportions of the primary and secondary components can be varied over a wide range, allowing significant variation in the viscosities, dispersibilities, dispersion stabilities and solids contents of the final coatings obtainable using the present invention. Our preferred working range allows variation in the relative proportions, in weight percent, of each component from 10% to 90% (i.e. 10% first component and 90% second component to 90% first component and 10% second component).

The cross-linking species of the present invention is preferably a monomeric or oligomeric polysiloxane that contains functional groups complementary to those of the base-polymer components. Preferably, the molecular weight of the cross-linking agent is between 2,000 and 5,000, although cross-linkers with molecular weights of 500 or even less may be usable under some circumstances. However, for thermal curing in an open environment, if the molecular weight of the cross-linking species is too low excessive amounts will evaporate from the reaction mixture.

For thermal curing, the fastest (and therefore most practical) cure times are obtained with relatively large numbers of functional groups distributed along the chains of the cross-linking component. However, while cross-linking molecules containing only terminal functional groups require significant reaction times, the compositions produced therewith tend to exhibit excellent elastomeric properties. Accordingly, our preferred route use a limited number of functional groups spaced as widely along the cross-linking chains as possible, the precise numbers and configuration being dictated by the user's reaction-time constraints.

2. Reactive Functional Groups

A wide range of complementary functional groups, and hence curing mechanisms, can be used with the present invention. For addition-cure coatings, our preferred functional group is vinyl; however, other α-olefinic groups such as allyl (1-propenyl) and 1-butenyl groups ar also readily employed in the two major components. Alternatively, it is possible to use higher alpha olefins up to 18 carbons as functional groups for addition-cure cross-linking. Such groups are advantageously employed in a hydrosilylation reaction in which a silicon-hydride-functional cross-linking species, such as a polyhydrosiloxane (e.g., a polymethylhydrosiloxane polymer, copolymer or terpolymer), or a polyfunctional polysilane, is employed. Hereafter, the term "silicon hydride" will be used generally to refer to species of the form $R_3SiH$, where each R independently represents an organic or inorganic atom or moiety covalenty bound to the silicon atom.

We also employ functional groups that are cross-linked by condensation-cure mechanisms (or the moisture-cure variation). For condensation-cure systems, the two major components contain silanol groups (i.e. hydroxyl functionalities), and the cross-linking component is silicon-hydride functional. Once again, suitable cross-linking species include polymethylhydrosiloxane polymers, copolymers and terpolymers, and polyfunctional polysilanes. It is also possible to utilize functional groups curable by ultraviolet or electron-beam radiation (either directly or via activated photoinitiator species), e.g., acrylate, methacrylate or cycloaliphatic-epoxy species.

Preferably, the functional groups of the two major components are present on the polymer chains in amounts not exceeding 1.0 mole percent, with the range 0.1 to 0.5 mole percent being especially preferred; in the case of vinyl functionalities, the especially preferred range is 0.1 to 0.3 mole percent.

It is not necessary for all functional groups to be identical within a particular polymeric composition, or even within a single component. By combining functional groups, we can exert control over the polymer networks that result from curing and thereby improve selected properties of a formulation (e.g., expansion of the range of substrates to which the formulation can be applied). For example, both base-polymer components of a single formulation may include 75% vinyl and 25% alkoxy groups. After combining the base polymers with a silicon-hydride functional cross-linker, one can first expose the polymer to addition-cure reaction conditions and then allow post-cross-linking exposure of the coating to ambient air to trigger subsequent moisture cure (i.e. reaction of the alkoxy groups to produce additional cross-linking and bonding to the substrate).

Alternatively, one can confine each of the vinyl and alkoxy functional groups to a single base-polymer component. Cross-linking the vinyl-functional base-polymer component results in an apparently solid coating matrix; while entrained therein, the second component remains chemically independent, and exposing the system to moisture results in formation of a second, interpenetrating polymer network. (It should be understood that the segregation or combining of functional groups among base-polymer components represents a consideration separate from the choice of where to position such functional groups along the chains.)

Use of a dual-cure approach can facilitate simultaneous exploitation of beneficial properties associated with two types of cross-linking molecules. For example, vinyl or other lowolefin groups tend to promote good abhesion properties, while acrylate and methacrylate cross-linkages tend to limit the degradative effects of solvent attack from printing inks. By combining these two groups within the first base-polymer component, we are able to produce dry-plate coatings that repel ink while resisting attack from the very solvents that are probably responsible for the ink-repellent behavior. Furthermore, because the free-radical linkage mechanism of the acrylate and methacrylate groups do not interfere with or participate in the hydrosilylation reaction that cross-links the vinyl and silicon hydride groups, these reactions are compatible with one another. It is also possible to utilize unmodified silicon hydride cross-linking molecules with this dual-cure reaction, since the acrylate and methacrylate groups react with one another directly (in the presence of suitable initiators).

Dual-cure coatings find particularly advantageous application to multi-layer printing-plate constructions such as those described in the '481 application. In these constructions, a high degree of intercoat adhesion between the near-IR absorbing layer and the overlying silicone layer is desirable. This can be accomplished with a dual-cure approach wherein one of the two main silicone components is acrylate- or methacrylate-functional (an acrylate-functional second component being particularly preferred) and further wherein the underlying layer also contains an acrylate- or methacrylate-functional species. Typically, the underlying layer is first applied and dried, taking care to avoid conditions that would prematurely react the acrylate- or methacrylate-functional components. The dual-cure silicone coating is then applied and the first curing reaction initiated; in a preferred embodiment, this first cure is a hydrosilylation between vinyl-functional groups of one of the two base-polymer components and a polymethylhydrosiloxane cross-linking component. The second curing reaction involving the acrylate- or methacrylate-functional groups is then initiated (ordinarily by exposure to an ultraviolet or electron-beam source and, in the case of ultraviolet exposure, in the presence of a suitable photoinitiator). The acrylate- or methacrylate-functional species in the underlying layer will also undergo reaction at this time, resulting in the formation of chemical bonds between, as well as within, the two layers.

Alternatively, the underlying layer can contain free vinyl or other α-olefinic species for reaction silicon hydride groups of the cross-linker, which also reacts with similar groups on at least one of the base-polymer components.

Preferred functional groups for applications in which the base-polymer components share at least one common functional group are those in which the common functional group is unreactive with itself but reactive with the cross-linker, or reactive with itself but unreactive with the cross-linker. In the former case, for example, the common group can be vinyl or other α-olefinic unsaturated groups with a silicon hydride cross-linker, or silicon hydride functional groups with a cross-linker bearing α-olefinic unsaturated groups. An example of the latter case is use of acrylate- or methacrylate-functional groups as the common species, with a cross-linker that combines with other base-polymer functional groups via addition cure or condensation cure.

When each base-polymer component bears a different functional group or groups, these should also be chosen so as to be unreactive with one another; however, at least one of the functional groups must react with the cross-linker. Preferred formulations include an addition-cure first component and cross-linker (e.g., where the first component contains vinyl groups and the cross-linker is a polyhydrosiloxane, or vice versa) and an acrylate- or methacrylate-functional second component; or a condensation-cure (or moisture-cure) first component and cross-linker (e.g., where the first component and cross-linker both contain silanol groups, or where one of the first component and cross-linker contains silanol groups and the other contains polyhydrosiloxane groups).

3. Loading with Pigments

If pigments or other solids are to be introduced into the final formulation, these can be dispersed within one of the components (preferably the high-molecular-weight first component) prior to combination of the two components, or within the final formulation after combination.

Although the formulations of the present invention can accommodate a large variety of pigments, preferred material are those that can enhance the response of a printing plate to ablative discharge. Particularly preferred pigments are described in U.S. Pat. Nos. 5,109,771 and 5,165,345, and U.S. application Ser. No. 07/894,027, the entire disclosures of which are hereby incorporated by reference.

4. Enhancing Absorption Characteristics

For a number of printing applications, it is useful to enhance the absorbence characteristics of a silicone coating with respect to certain kinds of radiation. This capability becomes important, for example, in connection with laser-based imaging systems. We have developed a number of approaches to enhance absorbence in one important spectral region, namely, the near-infrared ("near-IR") wavelength spectrum.

The simplest technique for enhancing absorbence of a coating is to disperse, within the polymer, compounds having appropriate response characteristics. The pigments discussed in Examples 5–11 below all perform well as near-IR absorbers.

Alternatively, chemical groups that exhibit near-IR absorbence can be incorporated within the backbone of the first and/or second base-polymer components. The absorptive strength of the chemical group and the number of such groups introduced into the backbone determine the overall absorbence of a silicone component. Siloxy compounds containing phthalocyanines or naphthalocyanines, for example, can be used as monomers in the synthesis of either or both base-polymer components. Naphthalocyanines suitable for incorporation in this manner are described in U.S. Pat. Nos. 4,977,068, 5,047,312, 5,039,798 and 5,023,168; analogous compounds that make use of phthalocyanine moieties can also be utilized advantageously. Thus, as an illustration, the naphthalocyanine species discussed in the '312 patent noted above comprise alkoxy-substituted silicon atoms bound to the naphthalocyanine-bearing silicon atom; such molecules may be copolymerized, in desired proportions, typically with other silanes or other functional silicone oligomers via the hydrolytic process, resulting in polymers that may be used as a component of the present invention.

It is also possible to use any of these compounds as additives to one or both base-polymer component through dispersion (rather than chemical incorporation) for simplicity.

5. Planographic Printing-Plate Constructions

The compounds of the present invention can be used as coatings in a wide variety of printing-plate constructions. Particular advantage is gained in connection with plates imaged by ablative discharge. Examples of such plates are given in the '027 and '481 applications, in allowed application Ser. No. 07/741,099 (the entire disclosure of which is hereby incorporated by reference), and in the '771 and '345 patents.

Such plates typically consist of a durable, oleophilic base material, an ablative layer (e.g., metal in the case of spark-discharge plates or a radiation-absorbing layer in the case of laser-imaged plates), and an oleophobic coating. Herein the term "substrate" is used in a generic sense to connote the plate layer or layers to which the oleophobic silicone coatings of the present invention are applied.

6. Examples

We will now describe preparation of several representative formulations.

EXAMPLES 1–8

In each of these eight examples, a pigment was initially dispersed into the high-molecular-weight gum component, which was then combined with the second component. For the gum component, we utilized a linear, dimethylvinyl-terminated polydimethylsiloxane supplied by Huls America, Bristol, Pa. under the designation PS-255. For each formulation, the gum component was combined with one of the following pigments:

| Pigment | Trade Name | Supplier |
|---|---|---|
| ZnO | Kadox 911 | Zinc Corp. of America Monaca, PA |
| $Fe_3O_4$ | BK-5000 | Pfizer Pigments, Inc. New York, NY |
| $SnO_2$-based | CPM 375 | Magnesium Elektron, Inc. Flemington, NJ |
| $SnO_2$-coated hollow sphere | ECP-S Micronized | E.I. duPont de Nemours Wilmington, DE |
| TiC | Cerex | Baikowski International Corp., Charlotte, NC |
| Heliogen Green | L 8730 | BASF Corp. Holland, MI |
| $WO_{2.9}$ | Tungsten Oxide Powder | Cerac Inc. Milwaukee, WI |
| $MnO_2$ | Manganese Dioxide Powder | Kerr-McGee Chemical Corp. Oklahoma City, OK |

The first four pigments have been found to be well-suited to non-contact spark-discharge imaging applications, while the next four provide good near-IR absorbance.

Each pigment was used to prepare a different formulation. First, pigment/gum dispersions were prepared by combining 50% by weight of each pigment and 50% by weight of the gum in a standard sigma arm mixer.

Next, the second component was prepared by combining 67.2% by weight of the mostly aliphatic (10% aromatic content) solvent marketed by Exxon Company, USA, Houston, Tex. under the trade name VM&P Naphtha with 16.9% of the vinyl-dimethyl-terminated polydimethylsiloxane compound marketed by Huls America under the designation PS-445, which contains 0.1-0.3% methylvinylsiloxane comonomer. The mixture was heated to 50-60 degrees Centigrade with mild agitation to dissolve the PS-445.

In separate procedures, 15.9% by weight of each pigment/gum dispersion was slowly added to the dissolved second component over a period of 20 minutes with agitation. Agitation was then continued for four additional hours to complete dissolution of the pigment/gum dispersions in the solvent.

After this agitation period, 0.1% by weight of methyl pentynol was added to each blend and mixed for 10 minutes, after which 0.1% by weight of PC-072 (a platinum-divinyltetramethyldisiloxane catalyst marketed by Huls) was added and the blends mixed for an additional 10 minutes. The methyl pentynol acts as a volatile inhibitor for the catalyst. At this point, the blends were filtered and labelled as stock coatings ready for cross-linking and dilution.

To prepare batches suitable for wire-wound-rod or reverse-roll coating applications, the stock coatings prepared above were each combined with VM&P Naphtha in proportions of 100 parts stock coating to 150 parts VM&P Naphtha; during this step, the solvent was added slowly with good agitation to minimize the possibility of the solvent shocking (and thereby disrupting) the dispersion. To this mixture was added 0.7 parts PS-120 (a polymethylhydrosiloxane cross-linking agent marketed by Huls) under agitation, which was continued for 10 * minutes after addition to assure a uniform blend. The finished coatings were found to have a pot life of at least 24 hours, and were subsequently cured at 300 degrees Fahrenheit for one minute.

EXAMPLES 9-11

In each of these next examples, commercially prepared pigment/gum dispersions were utilized in conjunction with a second, lower-molecular-weight second component. The pigment/gum mixtures, all based on carbon-black pigment, were obtained from Wacker Silicones Corp., Adrian, Mich. In separate procedures, we prepared coatings using PS-445 and dispersions marketed under the designations C-968, C-1022 and C-1190 following the procedures outlined above (but omitting the dispersing step). The following formulations were utilized to prepare stock coatings:

| Order of Addition | Component | Weight Percent |
|---|---|---|
| 1 | VM&P Naphtha | 74.8 |
| 2 | PS-445 | 18.0 |
| 3 | Pigment/Gum Disperson | 7.0 |
| 4 | Methyl Pentynol | 0.1 |
| 5 | PC-072 | 0.1 |

Coating batches were then prepared as described above using the following proportions:

| Component | Parts |
|---|---|
| Stock Coating | 100 |
| VM&P Naphtha | 100 |
| PS-120 (Part B) | 0.6 |

The three coatings thus prepared were found to be similar in cure response and stability to Examples 1-8.

EXAMPLE 12

The formulations described above undergo cross-linkage by addition-cure hydrosilylation reactions. It is possible to replace the olefin-functional groups with silanol groups to facilitate a condensation-cure mechanism, even utilizing the same PS-120 cross-linking agent. One approach to condensation cure is use of alkoxy functional groups to facilitate cure by exposure to moisture.

Dispersion of a pigment into a silanol-functional high-molecular-weight polymer is accomplished in the same manner as described in Examples 1-8. If PS-445 is retained as the low-molecular weight component, dual-cure is possible; replacing the olefin-functional PS-445 with a silanol-functional (or alkoxy-functional) silicone results in a single-cure reaction analogous to those described above.

Cross-linking to the silanol-functional groups is accelerated by a catalyst such as a dialkyltindicarboxylate (e.g., dibutyltindiacetate), a metal carboxylate (e.g., zinc dioctoate), a titanate, or a thermally activated latent catalyst (e.g., as described in published European Patent Application 338,947). None of these catalysts would be expected to interfere with the addition-cure components described above, thereby facilitating a dual-cure system. With this approach, the olefin-functional secondary component is subjected to the cross-linking conditions described in Examples 1-8 before silanol cross-linking.

EXAMPLE 13

We compared the solids content of an unpigmented coating prepared using our two-component approach to an unpigmented coating having similar viscosity but based entirely on the low-molecular-weight PS-445. Both coatings were prepared using the techniques outlined in Examples 1–8, but omitting the pigment-dispersion step. The proportions of reactants utilized in each of the coatings were as follows:

| Component | Weight Percent | |
|---|---|---|
| | Coating 1 | Coating 2 |
| VM&P Naphtha | 90.63 | 83.9 |
| PS-445 | 4.5 | 15.5 |
| PS-255 | 4.5 | — |
| Methyl Pentynol | 0.05 | 0.05 |
| PC-072 | 0.05 | 0.05 |
| PS-120 | 0.27 | 0.5 |

Coatings 1 and Coating 2 exhibit viscosities and can be applied using the same coating technique to yield similarly uniform coatings. However, the solids content of Coating 2—which represents a typical single-component approach—is approximately twice that of Coating 1. Furthermore, because both the viscosity and solids content of Coating 2 depend entirely on the proportion of a single silicone comopemer, coating viscosity requjirments impose a significant lijmtaion on the degree to which solids content can be altered.

By contrast, the formuation of Coating 1 can be altered by changing the relative proportions of PS-445 and PS-255, retaining a consistent viscosity while varying solids content. This is shown in the following two variations of Coating 1, one (Coating LS) formulated for low-solids content, and the other (Coating HS) formulated for high-solids content.

| Component | Weight Percent | |
|---|---|---|
| | Coating LS | Coating HS |
| VM&P Naphtha | 92.7 | 84.45 |
| PS-445 | 1.0 | 13.0 |
| PS-255 | 6.0 | 2.0 |
| Methyl Pentynol | 0.05 | 0.05 |
| PC-072 | 0.05 | 0.05 |
| PS-120 | 0.2 | 0.45 |

After solvent evaporation, Coating LS will deposit less than half the weight of silicone that would be deposited by Coating HS.

EXAMPLE 14

We modified Coating 1 of the previous example to obtain a diphenylsiloxane composition by replacing the PS-445 second component with an equivalent weight percentage of PS-767.5, also marketed by Huls. PS-767.5 is a vinyl-terminated 4–6%-diphenylsiloxane, 94–96% dimethylsiloxane copolymer.

The physical characteristics of this coating were similar to those of Examples 1–8, but would be expected to exhibit greater heat tolerance.

EXAMPLE 15

We modified Coating 1 of the previous example to obtain a trifluoro composition by replacing the PS-445 second component with an equivalent weight percentage of PLY-7801, marketed by McGhan Nusil Corp. of Carpinteria, Calif., and replacing the VM&P Naphtha with an equivalent weight percentage of 1,1,1-trichloroethane.

EXAMPLE 16

We modified Coating LS of the previous example to obtain a dual-cure composition by replacing the PS-445 second component with an equivalent weight percentage of PS-344.5, and replacing the PS-120 cross-linking agent with an equivalent weight percentage of PS-128; all components were supplied by Huls. PS-344.5 is a silanol-terminated polydimethylsiloxane compound, and PS-128 is a methyldimethoxy-terminated polymethylhydrosiloxane compound. Moisture activates the methoxy-silanol condensation reaction, which benefits from the acidic by-products of the chloroplatinic acid catalyst (PC-072) that accelerates the addition-cure reaction between the vinyl groups of the gum component and the hydrosiloxane groups of the cross-linking molecules.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed. For example, for production-scale coating preparation, it may be advantageous to add the second component directly to the gum/pigment dispersion to produce an easily handled paste; alternatively, it might prove desirable to add the solvent directly to the gum/pigment dispersion, or to add both the solvent and second component simultaneously.

What is claimed is:

1. A recording medium capable of being imaged using ablative discharge, comprising a substrate having applied to at least one surface thereof a composition comprising a cured polymeric silicone matrix consisting essentially of the reaction product of:
   a. a first polysiloxane component having a molecular weight in excess of 300,000 and comprising substantially linear chains of substituted siloxane units, some of which units contain, as substituents, at least one reactive functional group, each functional group being randomly interspersed in each first-component chain;
   b. a second polysiloxane component having a molecular weight in excess of 5,000 but no greater than 70,000, and comprising substantially linear chains of substituted siloxane units, each of which is capped by terminal siloxane units that each contain, as substituents, at least one reactive functional group; and
   c. a cross-linking component having a molecular weight no greater than 5,000 and containing functional groups reactive reactive with at least some of the functional groups of the first component or of the second component or of both components; wherein
   d. the relative weight proportion of the first component to the second component is at least 10% and no more than 90%.

2. The recording medium of claim 1 wherein none of the functional groups of the first component are reactive with any of the functional groups of the second component.

3. The recording medium of claim 2 wherein the functional groups of the first and second components are reactive with the functional groups of the cross-linking component.

4. The recording medium of claim 3 wherein the functional groups of the first and second components react with the functional groups of the cross-linking component via addition cure.

5. The recording medium of claim 3 wherein the functional groups of the first and second components are moieties and the functional groups of the cross-linking component are silicon-hydride species.

6. The recording medium of claim 3 wherein the functional groups of the first and second components are silicon-hydride moieties and the functional groups of the cross-linking component are α-olefinic moieties.

7. The recording medium of claim 2 wherein functional groups of only one of the first and second components are reactive with the functional groups of the cross-linking component.

8. The recording medium of claim 7 wherein the functional groups of one component react with the functional groups of the cross-linking component via addition cure.

9. The recording medium of claim 7 wherein the functional groups of the first component are selected from the group consisting of acrylate, methacrylate and epoxy species, the functional groups of the second component are α-olefinic species, and the functional groups of the cross-linking component are silicon-hydride species.

10. The recording medium of claim 7 wherein the functional groups of the first component are selected from the group consisting of acrylate, methacrylate and epoxy species, the functional groups of the second component are silicon-hydride species, and the functional groups of the cross-linking component are α-olefinic species.

11. The recording medium of claim 7 wherein the functional groups of the first component are α-olefinic species, the functional groups of the second component are selected from the group consisting of acrylate, methacrylate and epoxy species, and the functional groups of the cross-linking component are silicon-hydride species.

12. The recording medium of claim 7 wherein the functional groups of the first component are silicon-hydride species, the functional groups of the second component are selected from the group consisting of acrylate, methacrylate and epoxy species, and the functional groups of the cross-linking component are α-olefinic species.

13. The recording medium of claim 7 wherein the functional groups unreactive with the functional groups of the cross-linking component are reactive with one another.

14. The recording medium of claim 13 wherein the functional groups unreactive with the functional groups of the cross-linking component react with one another via exposure to electron-beam or ultraviolet radiation.

15. The recording medium of claim 13 wherein the functional groups unreactive with the functional groups of the cross-linking component are selected from the group consisting of acrylate, methacrylate and epoxy species.

16. The recording medium of claim 7 wherein the functional groups of one component react with the functional groups of the cross-linking component via condensation cure.

17. The recording medium of claim 7 wherein the functional groups of one component react with the functional groups of the cross-linking component via moisture cure.

18. The recording medium of claim 1 wherein the substrate comprises a strong oleophilic material and a metal layer.

19. The recording medium of claim 1 wherein the substrate comprises a strong oleophilic material and a radiation-absorptive layer.

20. The recording medium of claim 1 wherein the silicone composition further comprises at least one pigment dispersed therein.

21. The recording medium of claim 18 wherein the substrate, metal layer and silicone composition cooperate to form a planographic printing plate.

22. The recording medium of claim 18 wherein the substrate, metal layer and silicone composition cooperate to form a planographic printing plate.

23. The recording medium of claim 1 wherein the mole ratio of siloxane units containing a functional group to those which do not ranges from approximately 0.1 to 1.0 percent.

24. The recording medium of claim 1 wherein the siloxane units include dimethylsiloxane units.

25. The recording medium of claim 1 wherein at least 70% of the substituted siloxane units are dimethylsiloxane units.

26. The recording medium of claim 1 wherein the first molecular component has a molecular weight of at least 500,000.

27. The recording medium of claim 1 wherein the siloxane units also include higher alkylmethylsiloxane units, the alkyl group having up to 18 carbons.

28. The recording medium of claim 27 wherein the siloxane units also include phenylmethylsiloxane units.

29. The recording medium of claim 1 wherein the siloxane units also include diphenylsiloxane units.

30. The recording medium of claim 1 wherein the siloxane units also include 3,3,3-trifluoropropylmethylsiloxane units.

31. The recording medium of claim 30 wherein up to 80% of the substituted siloxane units are 3,3,3-trifluoropropylmethylsiloxane units.

32. The recording medium of claim 28 wherein the proportion of phenylmethylsiloxane units to dimethylsiloxane units does not exceed 20%.

33. The recording medium of claim 29 wherein the proportion of diphenylsiloxane units to dimethylsiloxane units does not exceed 20%.

34. The recording medium of claim 19 wherein the radiation-absorptive layer contains unreacted acrylate or methacrylate functional groups, and one of the two base-polymer components also contains acrylate or methacrylate functional groups.

35. The recording medium of claim 19 wherein the radiation-absorptive layer contains unreacted α-olefinic groups, and the cross-linking component contains silicon-hydride functional groups.

* * * * *